(12) United States Patent
Lee

(10) Patent No.: US 11,138,109 B2
(45) Date of Patent: Oct. 5, 2021

(54) CONTROLLER AND OPERATION METHOD THEREOF FOR MANAGING READ COUNT INFORMATION OF MEMORY BLOCK

(71) Applicant: SK hynix Inc., Gyeonggi-do (KR)

(72) Inventor: Jong-Min Lee, Seoul (KR)

(73) Assignee: SK hynix, Inc., Gyeonggi-do (KR)

( * ) Notice: Subject to any disclaimer, the term of this patent is extended or adjusted under 35 U.S.C. 154(b) by 0 days.

(21) Appl. No.: 16/778,322

(22) Filed: Jan. 31, 2020

(65) Prior Publication Data
US 2020/0334148 A1 Oct. 22, 2020

(30) Foreign Application Priority Data

Apr. 18, 2019 (KR) .................. 10-2019-0045308

(51) Int. Cl.
*G06F 12/0804* (2016.01)
*G06F 12/06* (2006.01)

(52) U.S. Cl.
CPC ...... *G06F 12/0804* (2013.01); *G06F 12/0646* (2013.01); *G06F 2212/1032* (2013.01)

(58) Field of Classification Search
CPC ......... G06F 2212/1032; G06F 12/0238; G06F 3/0614; G06F 3/0619; G06F 3/0679; G06F 3/0653; G06F 11/1417; G06F 11/1407
See application file for complete search history.

(56) References Cited

U.S. PATENT DOCUMENTS

| 2011/0113208 | A1 | 5/2011 | Jouppi et al. | |
|---|---|---|---|---|
| 2015/0095558 | A1* | 4/2015 | Kim | G11C 16/10 711/103 |
| 2015/0127887 | A1* | 5/2015 | Kim | G11C 5/143 711/103 |
| 2016/0124679 | A1* | 5/2016 | Huang | G11C 16/349 711/103 |
| 2016/0141046 | A1* | 5/2016 | Khandelwal | G11C 16/0483 365/185.02 |
| 2017/0075593 | A1 | 3/2017 | Kim et al. | |
| 2017/0169883 | A1* | 6/2017 | Kwon | G06F 3/064 |
| 2020/0065239 | A1* | 2/2020 | Shayesteh | G06F 3/0608 |

FOREIGN PATENT DOCUMENTS

| KR | 10-1470994 | 12/2014 |
|---|---|---|
| KR | 10-2018-0076715 | 7/2018 |

* cited by examiner

*Primary Examiner* — Tracy A Warren
(74) *Attorney, Agent, or Firm* — IP & T Group LLP

(57) ABSTRACT

A method for performing a sudden power-off recovery operation of a controller controlling a memory device, the method includes: obtaining open block information for open blocks of the memory device and read counts for the open blocks; updating each of the read counts by adding a set value to each of the read counts; storing the updated read counts in the memory device; sequentially reading pages in each of the open blocks without updating the read counts for the open blocks, based on the open block information, to detect a boundary page after the storing of the updated read counts in the memory device; and controlling the memory device to program dummy data in the detected boundary page.

14 Claims, 9 Drawing Sheets

FIG. 9

| BLOCK1 | BLOCK2 | BLOCK3 |
|---|---|---|
| DATA | DATA | DATA |
| DATA | DATA | DATA |
| DATA | BOUNDARY PAGE | DATA |
| DATA | ERASED PAGE | DATA |
| DATA | ERASED PAGE | DATA |
| BOUNDARY PAGE | ERASED PAGE | DATA |
| ERASED PAGE | ERASED PAGE | BOUNDARY PAGE |
| ERASED PAGE | ERASED PAGE | ERASED PAGE |

CONTROLLER AND OPERATION METHOD THEREOF FOR MANAGING READ COUNT INFORMATION OF MEMORY BLOCK

CROSS-REFERENCE TO RELATED APPLICATIONS

The present application claims priority under 35 U.S.C. § 119(a) to Korean Patent Application No. 10-2019-0045308, filed on Apr. 18, 2019, which is incorporated herein by reference in its entirety.

BACKGROUND

1. Field

Various embodiments of the present invention relate to a controller capable of controlling a memory device.

2. Description of the Related Art

The computer environment paradigm has been transitioning to ubiquitous computing, which enables computing systems to be used virtually anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since memory systems have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Embodiments of the present invention are directed to a controller and a method for operating the controller that may improve the reliability of data stored in the controller which performs a sudden power-off recovery operation.

In accordance with an embodiment of the present invention, a method for performing a sudden power-off recovery operation by a controller for controlling a memory device, the method includes: obtaining open block information for open blocks of the memory device and read counts for the open blocks; updating each of the read counts by adding a set value to each of the read counts; storing the updated read counts in the memory device; sequentially reading pages in each of the open blocks without updating the read counts of the open blocks based on the open block information to detect a boundary page after the storing of the updated read counts in the memory device; and controlling the memory device to program dummy data in the detected boundary page.

In accordance with another embodiment of the present invention, a controller for controlling a memory device includes: a block manager suitable for obtaining open block information for open blocks of the memory device and read counts for the open blocks while the memory device is booted after a sudden power-off and updating each of the read counts by adding a set value to each of the read counts; and a memory interface suitable for controlling the memory device to store the updated read counts, wherein the block manager sequentially reads pages in each of the open blocks without updating the read counts of the open blocks based on the open block information to detect a boundary page after the updated read counts are stored, and controls the memory device to program dummy data in the boundary page.

BRIEF DESCRIPTION OF THE DRAWINGS

FIG. 9 illustrates open blocks of a memory device.

DETAILED DESCRIPTION

Figure 1:
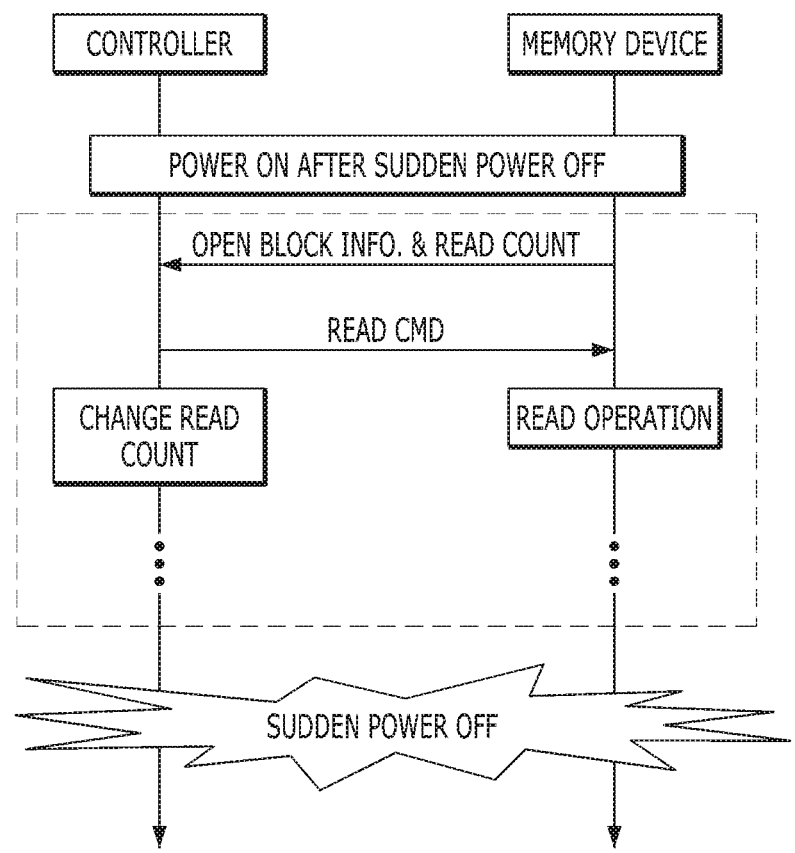
FIG. 1 illustrates an example of a conventional operation of a memory system.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, embodiments of the present invention will be described in more detail with reference to the drawings.

FIG. 1 illustrates an example of a conventional operation of a memory system.

Referring to FIG. 1, the memory system may include a memory device and a controller for controlling the memory device.

The memory device may include a plurality of non-volatile memory cells. The non-volatile memory cells may have a string structure. A set of memory cells having a string structure may be called a memory cell array. The memory cell array may include a plurality of memory blocks. Each memory block may include a plurality of pages. Each page may include a plurality of memory cells sharing one word line. The memory device may perform an erase operation on a memory block basis, and perform a read operation and a program operation on a page basis.

When the memory system is booted up after a sudden power-off occurs, the memory system may perform a sudden power-off recovery operation. The operations within the dashed line shown in FIG. 1 exemplarily illustrate a sudden power-off recovery operation.

When the sudden power-off occurs in the memory block in which a program operation is being performed, the program operation may be interrupted. The memory system may perform a sudden power-off recovery operation by detecting the next page of the last programmed page and programming dummy data in the next page.

When the memory system is powered on, the controller may obtain information regarding an open block (i.e., open block information) OPEN BLOCK INFO from the memory device 150. An open block may refer to a memory block in which a program operation for all memory cells has not been completed yet. The open block information may indicate which of the memory blocks in the memory device, is an open block.

The controller may acquire a read count READ COUNT for each open block, which is the number of read operations performed on a memory block, together with the open block information from the memory device. When a read operation is performed several times on a memory block, the data stored in the memory block may be damaged due to read disturbance. Therefore, the read count may represent the reliability of the data stored in the memory blocks. The controller may perform an operation for maintaining the reliability of the data stored in the memory block based on the read count of the memory device. For example, the controller may determine that the data to be programmed in an open block whose read count is greater than or equal to a threshold value is unreliable, and determine the open block to be a closed block.

The memory system may detect the next page of the last programmed page of open blocks as part of a sudden power-off recovery operation. The next page of the last programmed page may be referred to as a boundary page.

When boundary pages of open blocks are searched, the memory system may perform a read operation of each of the pages to determine whether each page of the open blocks is erased. The controller may refer to open block information and provide the memory device with a read command READ CMD for an open block. The memory device may perform a read operation in response to the read command. The controller may change the read count for the open block.

The controller may store the changed read count in a memory of the controller. The memory of the controller may be realized as a volatile memory. The controller may store the read count stored in the memory of the controller at a predetermined cycle in the memory device which includes a non-volatile memory cell. However, the memory system may lose the modified read count when a sudden power-off occurs before the read count stored in the memory of the controller is stored in the memory device.

When the power supply of the memory system is unstable, the sudden power-off may repeatedly occur. The sudden power-off recovery operation may be repeatedly performed in the same memory block due to the repeated sudden power-off. Therefore, the read count in the sudden power-off recovery operation may not be stored in the memory device due to the repeated sudden power-off. When the read count stored in the memory of the controller does not reach a threshold value even through the read operation is actually performed onto a memory block for a threshold number of times or more, the controller may not determine the memory block to be a closed block. When an open block in which a read operation is performed in the threshold number of times or more is not determined to be a closed block, the reliability of the data may not be guaranteed due to read disturbance.

According to the embodiment of the present invention, when the memory system is powered on after sudden power-off, the controller may obtain open block information and a read count from the memory device. The controller may change read counts of open blocks as much as a predetermined value based on the open block information and the read count, and may detect the boundary page after storing the changed read counts in the memory device. When the sudden power-off repeatedly occurs, the controller may store the read count of the open block that is changed by the operation of detecting the boundary page in the memory system. The controller may perform an operation for maintaining the reliability of the data stored in the memory blocks of the memory device based on the changed read count. Therefore, the reliability of the memory system may be improved.

Figure 2:
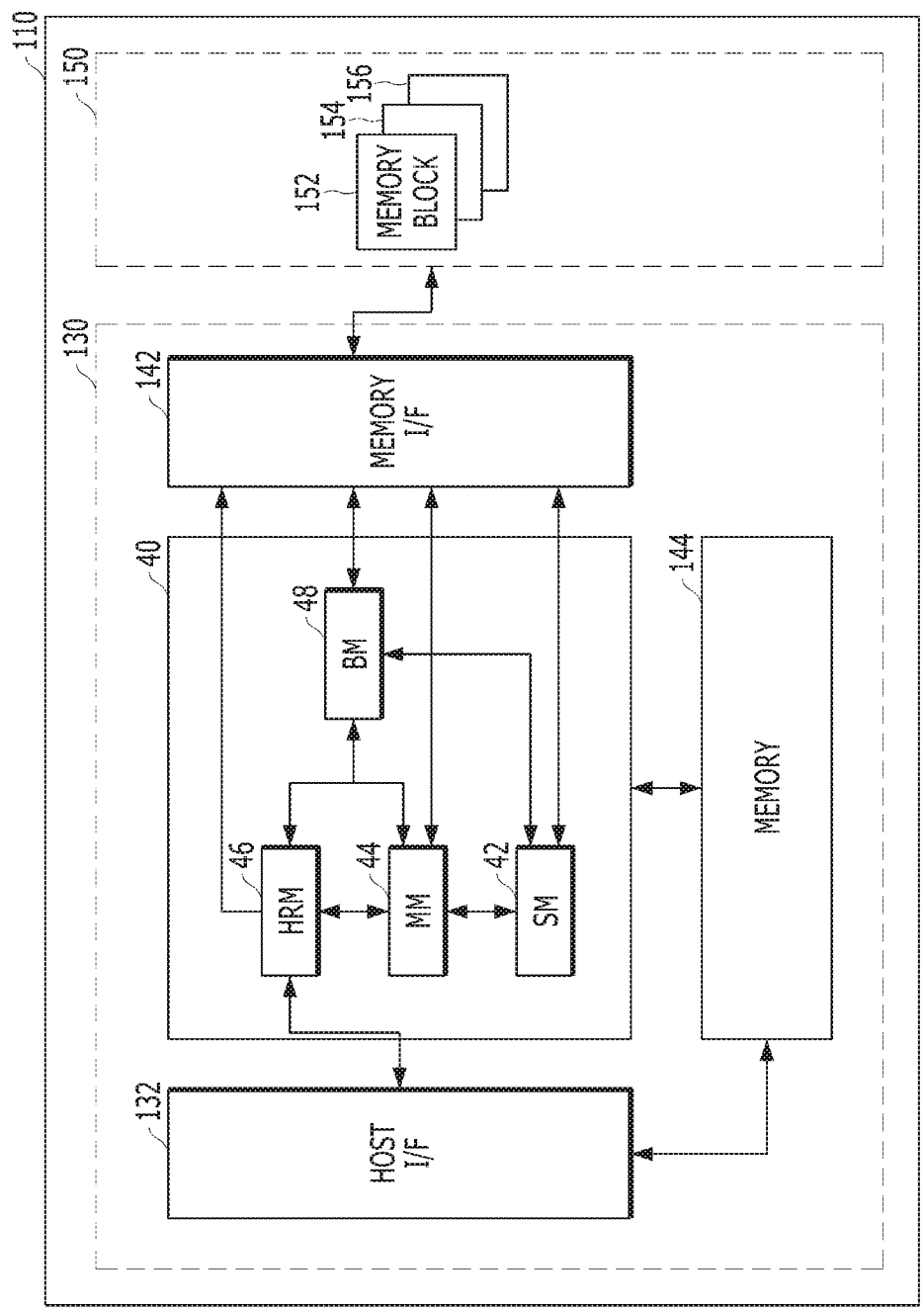
FIG. 2 is a block diagram illustrating a memory system in accordance with an embodiment of the present invention.

FIG. 2 is a block diagram illustrating a memory system 110 in accordance with an embodiment of the present invention.

Referring to FIG. 2, the memory system 110 may include the controller 130 and the memory device 150. The controller 130 may include a host interface (I/F) 132, a flash translation layer (FTL) 40, a memory interface (I/F) 142, and a memory 144 that are interlocked with each other.

The host interface 132 may be configured to process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The memory interface 142 may serve as a memory/storage interface for interfacing the controller 130 and the memory device 150 such that the controller 130 controls the memory device 150 in response to a request from the host 102. When the memory device 150 is a flash memory, specifically a NAND flash memory, the memory interface 142 may generate a control signal for the memory device 150 and process data to be provided to the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150.

The FTL 40 may include a host request manager (HRM) 46 for managing host requests that are received from the host interface 132, a map manager (MM) 44 for managing map data, a state manager (SM) 42 for performing a garbage collection operation or a wear leveling operation, and a block manager (BM) 48 for managing memory blocks and performing an operation according to a command in a memory block in the memory device.

For example, the host request manager 46 may process a read request, a write request, and a request based on an event that is received from the host interface 132 using the map manager 44 and the block manager 48. The host request manager 46 may provide the map manager 44 with a search request to detect a physical address corresponding to a logical address of the transferred request and provide the memory interface 142 with a read command for the physical address. The host request manager 46 may provide the block manager 48 with a write request in order to write data in a page of the memory device 150, which stores no data. Further, the host request manager 46 may provide the map manager 44 with a map update request to update mapping information between the logical address and the physical address.

The block manager 48 may convert write requests of the host request manager 46, the map manager 44, and the state manager 42 into program commands for the memory device 150. To maximize the performance of a write operation of the memory system 110, the block manager 48 may collect the write requests and provide the program commands for multiple planes and one-shot program operations to the memory interface 142. Also, various program commands may be provided to the memory interface 142 to maximize the parallel processing of the multi-channel and multi-directional flash controllers.

The block manager 48 may select and erase a block having no valid page when a spare block is needed. Further, the block manager 48 may select a block including the least number of valid pages when a garbage collection operation needs to be performed. The state manager 42 may perform a garbage collection operation to move the valid data of blocks into an empty block and erase the blocks so that the block manager 48 may have a sufficient number of empty blocks. When the block manager 48 provides the state manager 42 with information about the block to be erased, the state manager 42 may first check all of the pages of the block to be erased to determine whether each page is valid. For example, to determine the validity of each page, the state manager 42 may identify the logical address stored in a spare Out Of Band (OOB) area of each page, and then compare the physical address of the page with the physical address mapped to the logical address obtained from the search request of the map manager 44. The state manager 42 may provide the block manager 48 with program commands for each valid page. When the program operation is completed, the map manager 44 may update the mapping table.

The block manager 48 may manage the memory blocks in such a manner that the data stored in the memory blocks are not damaged. The block manager 48 may perform a sudden power-off recovery operation to prevent the reliability of the data from being degraded due to the sudden power-off. The block manager 48 may determine the open block to be a closed block based on the read count of the open block in order to prevent the reliability of the data from being degraded due to read disturbance.

The map manager 44 may manage the mapping table between the logical addresses and the physical addresses and may process requests such as an inquiry request and an update request, which are generated by the host request manager 46 and the state manager 42. The map manager 44 may store the entire map data in the map area of the memory device 150 and may cache at least some map data according to the capacity of the memory 144. When a map cache miss occurs while processing the search and update commands, the map manager 44 may provide the memory interface 142 with a read command to load the map data stored in the memory device 150. When the amount of data cached in the memory 144 of the map manager 44 exceeds a threshold value, the map manager 44 may provide the block manager 48 with a write command to store the map data cached in the memory 144 in the memory device 150.

When a garbage collection operation is performed, the host request manager 46 may write the latest version of the data for the same logical address of the page and simultaneously provide an update request while the state manager 42 is copying the valid page. The map manager 44 may not update the mapping table when the state manager 42 requests to update the map data in a state in which the copying of the valid page is not normally completed. The map manager 44 may be able to ensure accuracy by performing a map update operation only when the latest map table still indicates the previous physical address.

The memory 144 may serve as a working memory of the memory system 110 and the controller 130, and store data for driving the memory system 110 and the controller 130. The memory 144 may store data required for the controller 130 and the memory device 150 to perform data input/output operations.

The memory 144 may serve as a working memory of the memory system 110 and the controller 130, and store data for driving the memory system 110 and the controller 130. The controller 130 may control the memory device 150 to perform read, program and erase operations in response to a request from the host 102. The controller 130 may provide data read from the memory device 150 to the host 102, and may store data provided from the host 102 into the memory device 150. The memory 144 may store data required for the controller 130 and the memory device 150 to perform these operations.

The memory device 150 may include a plurality of memory blocks including single-level cell (SLC) memory blocks each of which stores one-bit data and multi-level cell (MLC) memory blocks each of which stores data of a plurality of bits. Each of the SLC memory blocks may include a plurality of pages, each of which includes memory cells each of which stores one-bit data. The SLC memory blocks may have high durability and fast data operation performance. Each of the MLC memory blocks may include a plurality of pages, each of which includes memory cells each of which stores multi-bit data, such as two bits or more. The MLC memory blocks may have a greater data storage space than the SLC memory blocks. In other words, the MLC memory blocks may be highly integrated.

The memory device 150 may be embodied by a two-dimensional (2D) or three-dimensional (3D) memory device. Each memory block in the memory device 150 may include a plurality of NAND strings NS that are extended in the second direction, and a plurality of NAND strings NS that are extended in the first direction and the third direction. Each of the NAND strings NS may be coupled to a bit line BL, at least one drain selection line DSL, at least one source selection line SSL, a plurality of word lines WL, at least one dummy word line DWL, and a common source line CSL. Each of the NAND strings NS may include a plurality of transistor structures.

Figure 3:
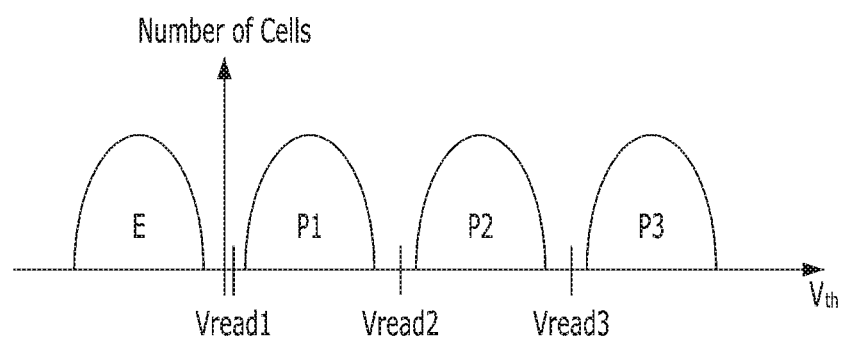
FIG. 3 illustrates threshold voltage distributions of memory cells in a memory device.

FIG. 3 illustrates threshold voltage distributions of memory cells in the memory device 150.

The memory device 150 may program data by applying voltages to word lines and bit lines connected to memory cells to be programmed in response to a write command. Unprogrammed memory cells may have a threshold voltage distribution of an erase state E. As voltages for programming data are applied to word lines and bit lines connected to the memory cells, the memory cells may have a target threshold voltage distribution.

When a multi-level memory cell is programmed, the multi-level memory cell may have any one threshold voltage distribution of program states P1, P2, P3 and the erase state E, depending on data to be programmed. When a read voltage Vread is applied to a word line coupled to the memory cell, the amount of current flowing through a bit line may be changed depending on the threshold voltage of the memory cell, such that the state of the memory cell is divided into each of the threshold voltage states.

Figure 4:
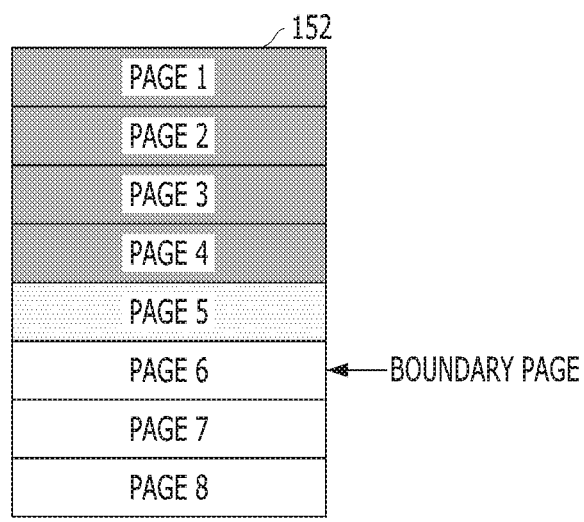
FIG. 4 illustrates a memory block in a memory device.

FIG. 4 illustrates a memory block 152 in the memory device 150.

Referring to FIG. 4, the memory block 152 may include eight pages PAGE 1 to PAGE 8. FIG. 4 exemplarily illustrates the memory block 152 at the moment when a sudden power-off occurs. The memory block 152 may be an open block where no memory cells are programmed. The first to fourth pages PAGE 1 to PAGE 4 of the memory block 152 may be pages in which a program operation is completed. The sixth to eighth pages PAGE 6 to PAGE 8 may be erased pages that are not programmed. The fifth page PAGE 5 may be the last programmed page. The program operation of the fifth page PAGE 5 may have been completed before the sudden power-off occurs, or the program operation may have been performing at the moment when the sudden power-off occurs.

In another case, the program operation may have been terminated when the memory cells of the fifth page PAGE 5 did not reach a target threshold voltage. In this case, the reliability of the data stored in the fifth page PAGE 5 is not ensured. However, even though there is a block including a reliable memory page, the memory system 110 may be able to use the remaining erased pages by programming the boundary page with dummy data. In the example of FIG. 4, the memory system 110 may program the dummy data into the next page after the fifth page PAGE 5 of the memory block 152, that is, the sixth page of the memory block 152, which is a boundary page. The memory system 110 may also be designed to further perform an operation of copying the data of the fifth page PAGE 5 into a seventh page PAGE 7.

Figure 5:
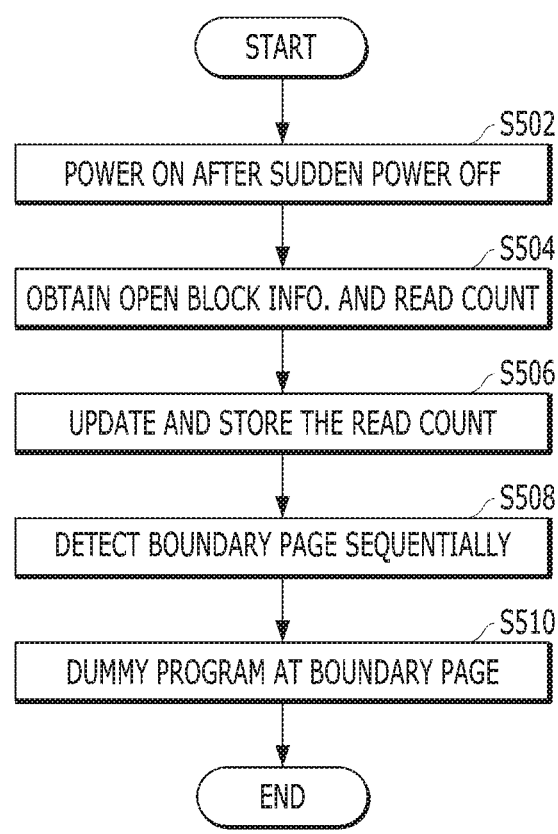
FIG. 5 is a flowchart illustrating a sudden power-off recovery operation of a memory system in accordance with an embodiment of the present invention.

FIG. 5 is a flowchart illustrating a sudden power-off recovery operation of the memory system 110 in accordance with an embodiment of the present invention.

Referring to FIG. 5, in step S504, when the power is turned on after a sudden power-off in step S502, the block manager 48 may acquire open block information and read counts of open blocks stored in the memory device 150 via the memory interface 142.

In step S506, the block manager 48 may update each of the read counts by adding a predetermined value to each of the read counts. Further, the block manager 48 may store the updated read counts in the memory device 150. The predetermined value may be the read count, which is the number of read operations expected to be performed in each open block in subsequent step S508.

In step S508, the block manager 48 may sequentially read the pages in each of the open blocks based on the open block information to detect a boundary page. Since the read counts are updated by adding the read count of a read operation that is expected to be performed in each open block in step S506, when the pages in each of the open blocks are sequentially read in step S508, the read count may not be counted.

The order of reading the pages may be determined in advance according to how the controller 130 is designed. For example, the block manager 48 may detect a boundary page based on a linear search scheme. The linear search scheme is a method of detecting a boundary page by performing read operations on the pages of an open block in the order that the pages are arranged or in the reverse order of the order that the pages are arranged. As another example, the controller 130 may detect a boundary page based on a boundary search scheme. The boundary search scheme is a method of detecting a boundary page by narrowing the range of the pages to be searched based on the result of performing a read operation on a page located at the center of the pages to be searched.

In step S510, the block manager 48 may provide the memory device 150 with a program command to program dummy data in the boundary page of each of the open blocks.

Figure 6:
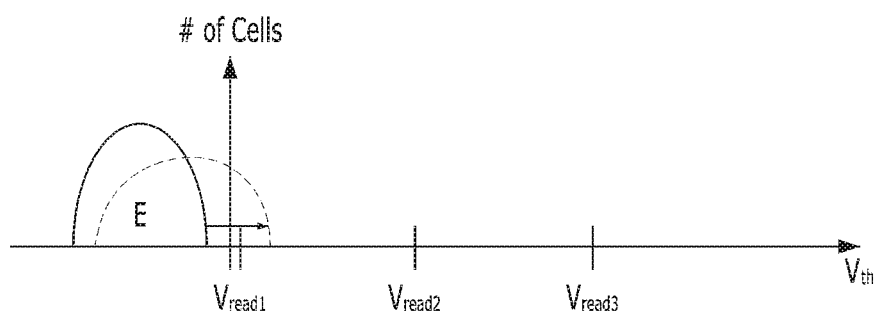
FIG. 6 is a diagram illustrating a threshold voltage distribution of memory cells in an erase state in a memory device.

FIG. 6 is a diagram illustrating a threshold voltage distribution of memory cells in an erase state in a memory device.

The open block may be a memory block in which a program operation for all memory cells is not completed. The open block may include memory cells in an erase state. When the memory cells of the open block are read, the threshold voltage distribution of the memory cells in the erase state may be distorted due to disturbance. When the threshold voltage of the memory cells in the erase state increases, the memory cells in the erase state may be recognized as being in a program state. The threshold voltage shown by the dotted line in the graph of FIG. 6 may represent a distorted threshold voltage distribution.

When data are programmed in the memory cells in the erase state whose threshold voltage distribution is distorted and the data are read, an error may occur, which may not be corrected even by an error correction decoding.

The controller 130 may determine the open block to be a closed block based on the read count of the open block in the memory device 150 to protect the data from being damaged due to the disturbance of the memory cells in the erase state, and may not perform a program operation any more.

Figure 7:
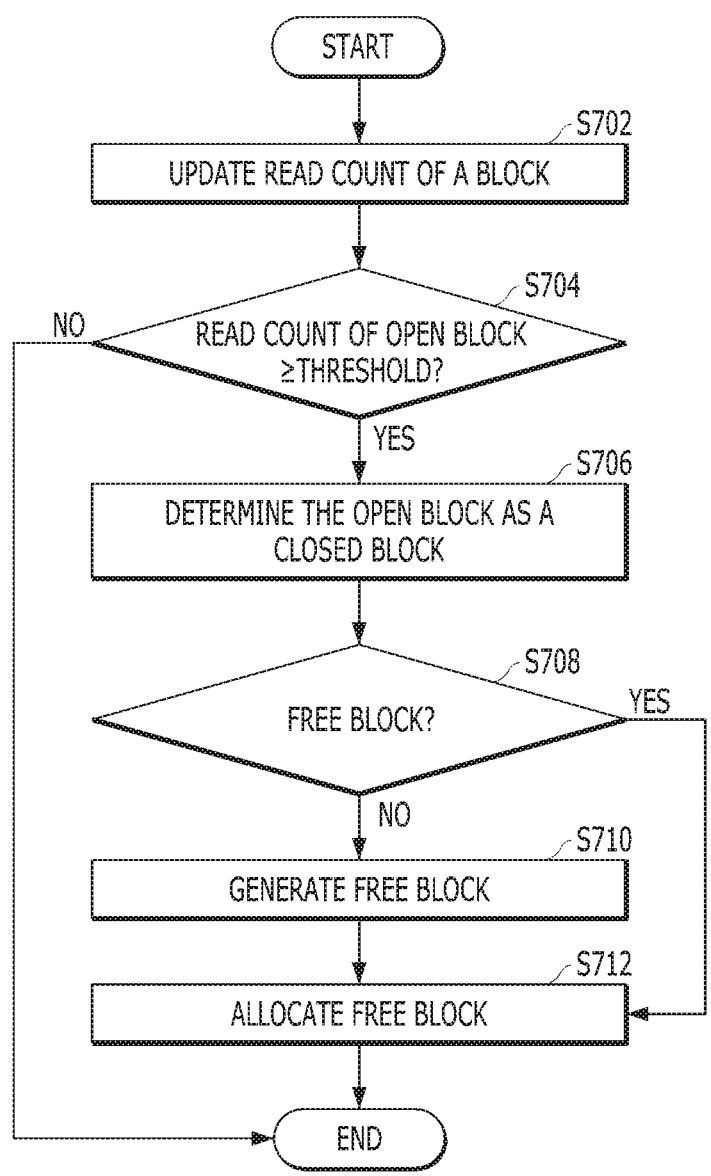
FIG. 7 is a flowchart illustrating an operation of a memory system.

FIG. 7 is a flowchart illustrating an operation of the memory system 110.

Referring to FIG. 7, in step S702, the block manager 48 may update a read count of a memory block. The read count corresponds to the number of read operations performed on the memory block. For example, step S702 may include step S506, which is described earlier with reference to FIG. 5. For example, the block manager 48 may update the read count in response to a read command of the memory block when a sudden power-off recovery operation is not performed.

In step S704, the block manager 48 may determine whether the read count of an open block is greater than or equal to a threshold value. For example, the block manager 48 may perform the operation of step S704 after performing the operations of steps S508 to S510 in FIG. 5. When the block manager 48 does not perform a sudden power-off recovery operation and when the memory block whose read count is updated in step S702 is an open block, the block manager 48 may perform the operation of step S704.

When the read count of an open block is less than the threshold value ('NO' in the step S704), the block manager 48 may terminate the operation.

When the read count of the open block is greater than or equal to the threshold value ('YES' in the step S704), the block manager 48 may prevent a program operation from being performed on the open block in step S706 by determining the open block to be a closed block.

In step S708, the block manager 48 may determine whether the memory device 150 has a free block. A free block may refer to a memory block in which all the memory cells are not programmed yet.

When there is a free block in the memory device 150 ('YES' in the step S708), the block manager 48 may allocate the free block instead of the open block which is determined to be the closed block in step S712. For example, when the read count of the open block for programming user data becomes greater than or equal to the threshold value, the open block may be determined to be a closed block, and the free block may be allocated to program the user data in the free block.

When there is no free block in the memory device 150 ('NO' in the step S708), the block manager 48 may generate a free block in step S710. In one example, the block manager 48 may control the memory device 150 to erase a memory block that stores only invalid data. The block manager 48 may then perform the operation of step S712.

Figure 8:
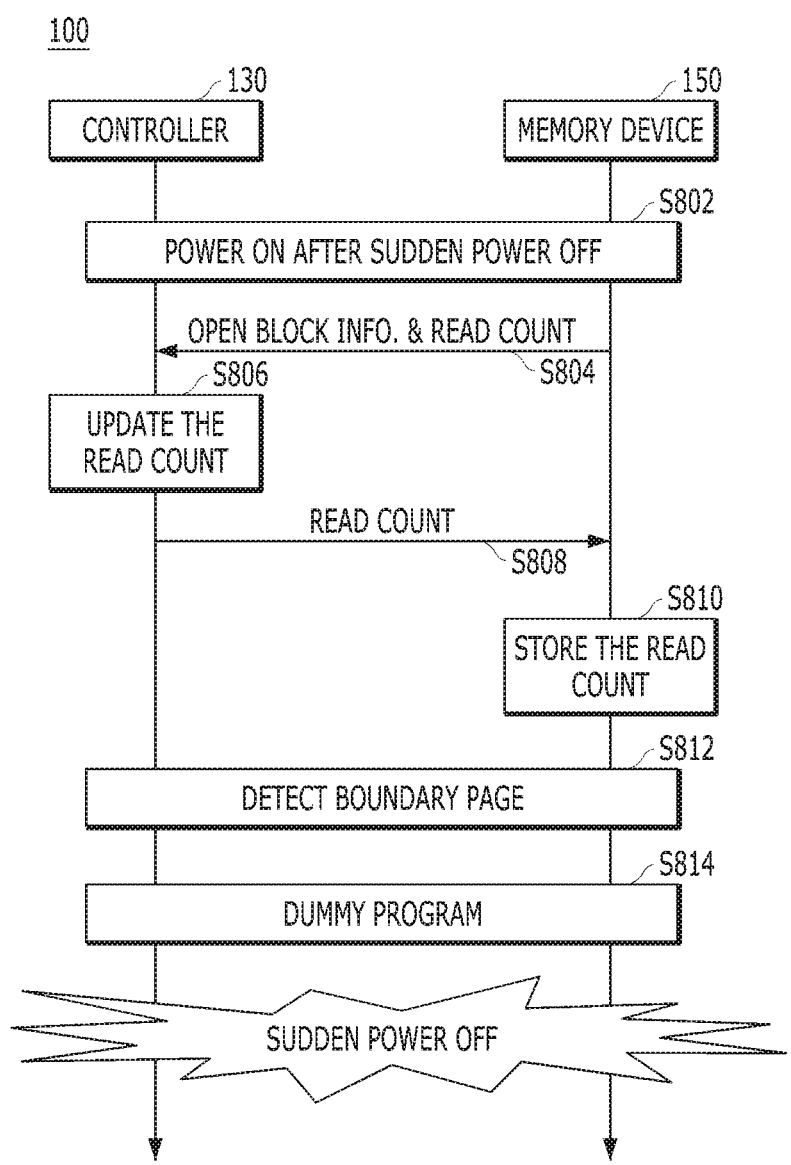
FIG. 8 illustrates a sudden power-off recovery operation of a memory system in accordance with an embodiment of the present invention.

FIG. 8 illustrates a method of performing a sudden power-off recovery operation of the memory system 110 in accordance with an embodiment of the present invention.

Referring to FIG. 8, when the power of the memory system 110 is turned on after a sudden power-off in step S802, the block manager 48 may obtain the open block information and the read count from the memory device 150 in step S804.

In step S806, the block manager 48 may update the read count by adding a predetermined value to the read count of each open block.

According to the embodiment of the present invention, the predetermined value may be the maximum read count, which is the maximum number of read operations that may be performed on one open block in a sudden power-off recovery operation. The maximum read count may be the maximum number of times obtained based on a search scheme for detecting the boundary page described above. For example, the block manager 48 may detect the boundary page of an open block based on a binary search scheme. The time complexity of the binary search scheme may be O(log n). Therefore, in the memory block including 2n pages, the block manager 48 may be able to detect the boundary page by performing the read operation for a maximum of n times. In one example, when the memory device 150 includes memory blocks each of which includes 2n pages and the block manager 48 detects a boundary page based on the binary search scheme, the predetermined value may be n. As another example, the block manager 48 may detect the boundary page of the open block based on a linear search scheme. When the memory device 150 includes memory blocks each of which includes 2n pages and the block manager 48 detects the boundary page based on the linear search scheme, the predetermined value may be 2n.

According to the embodiment of the present invention, the predetermined value may be determined as an average read count. The average read count is the average number of read operations performed on one open block in a sudden power-off recovery operation.

In step S808, the block manager 48 may provide the memory device 150 with a program command for storing the updated read count via the memory interface 142. In step S810, the memory device 150 may store the updated read count in a memory block in response to the program command.

In step S812, the block manager 48 may detect a boundary page. Since the block manager 48 updates in advance, the read count of each of the open blocks in steps S806 to S810, the block manager 48 may not update the read count for each of the open blocks in step S812.

In step S814, the block manager 48 may store dummy data in the boundary page of each of the open blocks.

When the power supply of the memory system 110 is unstable, sudden power-off may occur in the memory system 110 while the operations of steps S812 to S814 are being performed. According to the embodiment of the present invention, the block manager 48 may update in advance, the number of read operations that may be performed when detecting the boundary page in step S812, into the read count for each open block in steps S806 to S810, and store the read counts in the memory device 150. Therefore, even though sudden power-off occurs in the memory system 110 during the operations of steps S812 to S814, the number of read operations performed when detecting a boundary page may be stored in the memory device 150. The block manager 48 may store the number of read operations performed when detecting a boundary page in the memory device 150, even though sudden power-off occurs repeatedly in the memory system 110.

The block manager 48 may be able to accurately determine the reliability of the data stored in the open block based on the read count for each of the open blocks stored in the memory device 150 even though sudden power-off occurs repeatedly in the memory system 110. The block manager 48 may perform a memory block management operation for determining an open block to be a closed block based on the read count. Thus, the reliability of the memory system 110 may be improved.

FIG. 9 illustrates open blocks of a memory device 150.

The memory system 110 may be designed to concurrently have a plurality of open blocks during an operation of the memory system 110. For example, the memory device 150 may include user blocks for storing user data, map blocks for storing map data, and history blocks for storing history data. Since the controller 130 can store all the user data, map data, and history data during the operation of the memory system 110, the memory device 150 may determine one of the user blocks, one of map blocks, and one of history blocks as open blocks. FIG. 9 illustrates a case where the memory device 150 includes three open blocks BLOCK1, BLOCK2, and BLOCK3.

Referring back to FIG. 8, the block manager 48 may update the read count by adding a predetermined value to the read count for each of the open blocks before performing a sudden power-off recovery operation. According to the embodiment of the present invention, the predetermined value may be a variable value determined for each open block.

According to the embodiment of the present invention, the block manager 48 may randomly determine the predetermined value for each open block, whenever a sudden power-off recovery operation is performed.

According to the embodiment of the present invention, the block manager 48 may randomly determine the predetermined value between a predetermined upper limit and a predetermined lower limit for each open block, whenever a sudden power-off recovery operation is performed. For example, the lower limit may be the maximum read count, which is the maximum number of read operations performed on one open block. The maximum read count of the read operation may be the maximum number of times obtained based on the search scheme for detecting the boundary page. For another example, the lower limit may be the average read count, which is the average number of read operations performed on one open block in the sudden power-off recovery operation.

According to the embodiment of the present invention, the block manager 48 may set a difference to be the predetermined value for each open block. For example, the block manager 48 may determine a predetermined value of a user block among the open blocks. As another example, the block manager 48 may determine the predetermined value such that the predetermined value gradually increases in an order determined based on the identifier for each open block. The block manager 48 may respectively determine the predetermined value to be '10', '20', '30' in the order of a first block BLOCK1, a second block BLOCK2 and a third block BLOCK3, in the memory device 150 of FIG. 9. The block manager 48 may periodically change the above order. For example, when the sudden power-off occurs consecutively for a predetermined number of times or more, the predetermined value may be sequentially set to '10', '20' and '30' in the order of the second block BLOCK2, the third block BLOCK3, and the first block BLOCK1, respectively.

When the block manager 48 independently determines the predetermined value according to each open block, different values may be added to the read count for each open block whenever a sudden power-off recovery operation is performed and reflected into the memory system 110.

When the read count of the open block is greater than or equal to the threshold value even when a sudden power-off recovery operation is being performed, the block manager 48 may determine the corresponding open block to be a closed block as described with reference to FIG. 7, and allocate a free block instead of the corresponding open block. When there are no free blocks in the memory device 150, the block manager 48 may perform an erase operation on a plurality of memory blocks to generate a plurality of free blocks for replacing the open blocks. When there are a plurality of open blocks whose read counts simultaneously reach a threshold value while a sudden power-off recovery operation is being performed, the memory system 110 may perform an erase operation on the memory blocks and thereby the time taken for performing the sudden power-off recovery operation may become long.

When the block manager 48 independently determines the predetermined value according to each open block, the read count of each open block may uniformly increase and it may be possible to prevent the number of memory blocks whose read counts reach the threshold value from increasing while a sudden power-off recovery operation is being performed. Therefore, according to the embodiment of the present invention, the performance of the memory system 110 may be improved by preventing the time taken for the sudden power-off recovery operation of the memory system 110 from being prolonged.

According to the embodiment of the present invention, the reliability of data stored in the controller which performs a sudden power-off recovery operation may be improved.

According to the embodiment of the present invention, even when the power supply of the memory system is unstable, the controller controlling a memory device may be able to accurately determine the extent of data loss of the memory device and perform an operation for maintaining the reliability.

The effects that may be obtained by the technology of the present invention are not limited to the effects mentioned above, and it will be apparent to those skilled in the art to which the present invention pertains that there may be other effects not disclosed in the following specification.

While the present invention has been described with respect to the specific embodiments, it will be apparent to those skilled in the art that various changes and modifications may be made without departing from the spirit and scope of the invention as defined in the following claims.

What is claimed is:

1. A method for performing a sudden power-off recovery operation of a controller controlling a memory device, the method comprising:
   obtaining open block information for open blocks of the memory device and read counts for the open blocks;
   updating at least one of the read counts by adding an expected read count to the at least one of the read counts;
   storing the updated read counts in the memory device before reading pages in each of the open blocks; and
   sequentially reading pages in each of the open blocks without updating the at least one of the read counts of the open blocks based on the open block information to detect a boundary page after the storing of the updated read counts in the memory device.

2. The method of claim 1, wherein the expected read count includes a maximum read count of read operations that are performed in one open block, based on a boundary page search scheme.

3. The method of claim 1, wherein the expected read count includes an average read count of read operations that are performed in one open block.

4. The method of claim 2, wherein the boundary page search scheme includes a linear search scheme.

5. The method of claim 2, wherein the boundary page search scheme includes a binary search scheme.

6. The method of claim 1, further comprising:
   determining a selected open block to be a closed block based on the updated read counts; and
   allocating a free block.

7. The method of claim 6, wherein the allocating of the free block comprises:
   generating the free block by erasing a memory block in which only invalid data are stored.

8. A controller for controlling a memory device, comprising:
   a processor suitable for obtaining open block information for open blocks of the memory device and read counts for the open blocks while the memory device is booted after a sudden power-off and updating at least one of the read counts by adding an expected read count to the at least one of the read counts; and
   a memory interface suitable for controlling the memory device to store the updated read counts before reading pages in each of the open blocks,
   wherein the processor sequentially reads pages in each of the open blocks without updating the at least one of the read counts of the open blocks based on the open block information to detect a boundary page after the updated read counts are stored.

9. The controller of claim 8, wherein the expected read count includes a maximum read count of read operations that are performed in one open block, based on a boundary page search scheme.

10. The controller of claim 8, wherein the expected read count includes an average read count of read operations that are performed in one open block.

11. The controller of claim 9, wherein the boundary page search scheme includes a linear search scheme.

12. The controller of claim 9, wherein the boundary page search scheme includes a binary search scheme.

13. The controller of claim 8, wherein the processor determines a selected open block to be a closed block based on the updated read counts; and
   allocates a free block.

14. The controller of claim 13, wherein the processor generates the free block by erasing a memory block in which only invalid data are stored.

* * * * *